(12) United States Patent
Kikuchi (10) Patent No.: US 8,829,534 B2
(45) Date of Patent: Sep. 9, 2014

(54) POWER SEMICONDUCTOR DEVICE

(75) Inventor: Masao Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 458 days.

(21) Appl. No.: 13/032,997

(22) Filed: Feb. 23, 2011

(65) Prior Publication Data

US 2011/0291106 A1 Dec. 1, 2011

(30) Foreign Application Priority Data

Jun. 1, 2010 (JP) .................. 2010-125429

(51) Int. Cl.
*H01L 29/24* (2006.01)
*H01L 23/433* (2006.01)
*H01L 25/07* (2006.01)
*H01L 25/18* (2006.01)
*H01L 23/552* (2006.01)
*H01L 23/31* (2006.01)
*H01L 23/00* (2006.01)

(52) U.S. Cl.
CPC ........ *H01L 23/3107* (2013.01); *H01L 23/4334* (2013.01); *H01L 24/30* (2013.01); *H01L 25/072* (2013.01); *H01L 2924/10272* (2013.01); *H01L 2224/48225* (2013.01); *H01L 2924/01005* (2013.01); *H01L 24/45* (2013.01); *H01L 2924/3511* (2013.01); *H01L 24/29* (2013.01); *H01L 24/48* (2013.01); *H01L 24/32* (2013.01); *H01L 2924/01006* (2013.01); *H01L 2224/73265* (2013.01); *H01L 2924/13055* (2013.01); *H01L 25/18* (2013.01); *H01L 23/552* (2013.01); *H01L 2924/014* (2013.01); *H01L 2924/13091* (2013.01); *H01L 24/73* (2013.01); *H01L 2224/73221* (2013.01); *H01L 2224/40137* (2013.01); *H01L 2924/01079* (2013.01); *H01L 2224/73215* (2013.01); *H01L 2924/01082* (2013.01); *H01L 2224/06181* (2013.01); *H01L 2224/291* (2013.01); *H01L 2224/451* (2013.01); *H01L 2224/32245* (2013.01); *H01L 2924/01068* (2013.01); *H01L 2224/73263* (2013.01); *H01L 2224/30181* (2013.01); *H01L 2924/1815* (2013.01); *H01L 2924/01033* (2013.01); *H01L 24/34* (2013.01); *H01L 24/06* (2013.01)
USPC ........ 257/77; 257/675; 257/678; 257/E23.08; 257/E29.104

(58) Field of Classification Search
CPC ................ H01L 2224/48091; H01L 23/4334; H01L 2924/00014
USPC .............. 257/77, E29.104, 675, 678, E23.08
See application file for complete search history.

(56) References Cited

U.S. PATENT DOCUMENTS 6,521,983 B1  2/2003  Yoshimatsu et al.
(Continued)

FOREIGN PATENT DOCUMENTS

DE    101 01 078 A1    3/2002
DE    102 51 248 A1    10/2003
(Continued)

OTHER PUBLICATIONS

German Office Action issued Oct. 26, 2012, in German Patent Application No. 10 2011 076 235.3 (with partial English translation).

(Continued)

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

Provided is a power semiconductor device including: a power semiconductor element; a metal block as a first metal block that is connected to the power semiconductor element through an upper surface electrode pattern as a first upper surface electrode pattern selectively formed on an upper surface of the power semiconductor element; and a mold resin filled so as to cover the power semiconductor element and the metal block, wherein an upper surface of the metal block is exposed from a surface of the mold resin.

20 Claims, 7 Drawing Sheets

(56) References Cited

U.S. PATENT DOCUMENTS

| | | |
|---|---|---|
| 6,984,884 B2 | 1/2006 | Kikuchi |
| 7,151,311 B2 | 12/2006 | Nakajima et al. |
| 7,855,464 B2 | 12/2010 | Shikano |
| 8,183,094 B2 | 5/2012 | Shikano |
| 8,222,741 B2 | 7/2012 | Bayerer et al. |
| 2003/0213979 A1 | 11/2003 | Nakajima et al. |
| 2007/0182003 A1 | 8/2007 | Huber |
| 2009/0057929 A1 | 3/2009 | Sasaki et al. |
| 2010/0127383 A1* | 5/2010 | Oka et al. .............. 257/692 |

FOREIGN PATENT DOCUMENTS

| | | |
|---|---|---|
| DE | 10 2006 005 420 A1 | 9/2007 |
| DE | 10 2006 014 582 A1 | 10/2007 |
| DE | 10 2009 011 233 A1 | 1/2010 |
| JP | 57-10952 | 1/1982 |
| JP | 9-283681 | 10/1997 |
| JP | 2004-165281 | 6/2004 |
| JP | 2005-217072 | 8/2005 |
| JP | 2005-294464 | 10/2005 |
| JP | 2007-235004 | 9/2007 |
| JP | 2007-273884 | 10/2007 |
| JP | 2009-59923 | 3/2009 |
| JP | 2009-200416 | 9/2009 |
| JP | 2010-21338 | 1/2010 |

OTHER PUBLICATIONS

U.S. Appl. No. 13/405,720, filed Feb. 27, 2012, Kikuchi.
U.S. Appl. No. 13/184,717, filed Jul. 18, 2011, Kikuchi, et al.
Combined Office Action and Search Report issued May 16, 2013 in Chinese Application No. 201110158241.5 (With English Translation).
Japanese Office Action issued Jan. 22, 2013, in Patent Application No. 2010-125429 (with partial English-language translation).
Office Action issued Nov. 8, 2013 to Chinese Patent Application No. 201110158241.5, with partial English translation.
Office Action issued Dec. 17, 2013 to Japanese Patent Application No. 2013-042877, with partial English translation.
Office Action issued Mar. 20, 2014 to German Patent Application No. 10/2011 122 920.9, with English translation.
Office Action mailed May 22, 2014, in Chinese Patent Application No. 201110158241.5 (with partial English-language translation).

* cited by examiner

POWER SEMICONDUCTOR DEVICE

BACKGROUND OF THE INVENTION

1. Field of the Invention

The present invention relates to a power semiconductor device widely used for a variety of purposes, which is, for example, mounted on a vehicle and used in FA equipment and an electric railway.

2. Description of the Background Art

A power semiconductor device houses power semiconductor elements and has a function of adjusting electric power by switching operations of the power semiconductor elements. This power semiconductor device is provided with a wiring line for the housed power semiconductor elements and the outside of the device.

As to the power semiconductor element housed in the conventional device, it is soldered to an insulating substrate, and a wiring line is formed by a wire or a metal lead from the insulating substrate or the element main body and is connected to a metal terminal guided outside the device.

The metal terminal is buried in a resin case of the device, and is guided outside the device from around the power semiconductor element. Alternatively, the metal terminal is connected to a wiring line on the insulating substrate positioned around the power semiconductor element and is guided outside the device. The device is filled with a resin so as to cover the insulating substrate, power semiconductor elements, metal wiring line and metal terminal, and is protected from the outside.

In contrast, there is a power semiconductor device in which a wiring line for a power semiconductor elements and the outside of the device is formed with a lead frame made of metal, and the wiring line using the lead frame is molded with a hard resin to be packaged (for example, see Japanese Patent Application Laid-Open No. 2004-165281). The wiring line is molded to be hardened, and then the essential spots of the lead frame thereof are subjected to cutting and bending, whereby the wiring line is provided to the device. Contrary to the device of the above-mentioned resin-filling type device, a lead frame in which metal leads have been lined in advance is used for manufacture in this case. Accordingly, in a case of mass production, this is put to practical use as the structure whose productivity is considerably high. Further, the wiring line is hardened with a hard resin, and thus the stress due to thermal expansion mismatching between the power semiconductor element and the other metal member whose thermal expansion differs from each other by a large amount can be dispersed. Therefore, the above-mentioned device is considerably useful for improving long-term reliability that has been highly valued.

In this power semiconductor device, the metal wiring line of a lead frame is formed around the power semiconductor elements and is guided outside the device from a portion other than above or below the portion in which the power semiconductor elements are mounted. This causes a problem that dead space is provided above or below the portion in which the power semiconductor devices are mounted, leading to a larger size of the power semiconductor device.

Further, there is conceivable a structure in which a metal terminal is bent to be formed in an upper portion of the device after the metal wiring line formed around the power semiconductor elements is guided outside the device. However, this causes such problems that a longer wiring line increases an inductance, and a larger lead frame reduces a material yield.

SUMMARY OF THE INVENTION

An object of the present invention is to provide a power semiconductor device capable of preventing a size thereof from increasing and limiting an increase in inductance.

According to a first aspect of the present invention, a power semiconductor device includes: a power semiconductor element; a first metal block connected to the power semiconductor element through a first upper surface electrode pattern selectively formed on an upper surface of the power semiconductor element; and a mold resin filled so as to cover the power semiconductor element and the first metal block. An upper surface of the first metal block is exposed from a surface of the mold resin.

Further, according to a second aspect of the present invention, a power semiconductor device includes: a power semiconductor element; a first metal lead having one end side connected to the power semiconductor element and the other end side guided to above the power semiconductor element; a mold resin filled so as to cover the power semiconductor element and the one end side of the first metal lead and having a recess formed above the power semiconductor element; and a first metal block housed in the recess. The other end side of the first metal lead is connected to an upper surface of the first metal block by being bent.

According to the power semiconductor device according to the first and second aspects of the present invention, it is possible to draw a wiring line from the upper surface of the power semiconductor device and prevent the device from increasing in size.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

A-1. Configuration

Figure 1A:
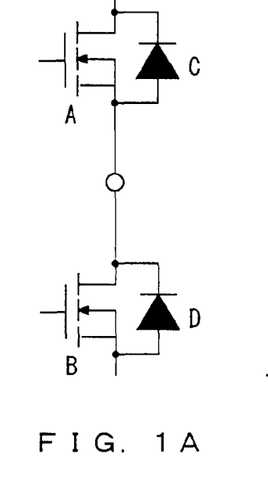
FIGS. 1A and 1B show the circuitry of a power semiconductor device according to a first preferred embodiment.
Figure 1B:
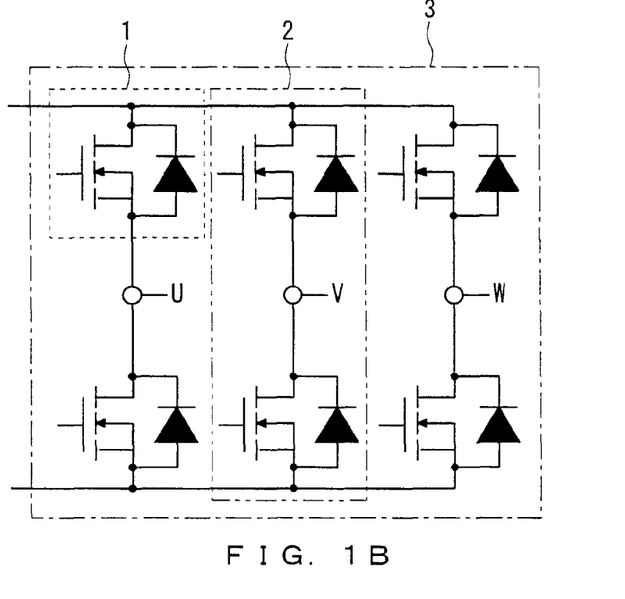

FIGS. 1A and 1B partially show the circuitry of a power semiconductor device which is a representative example and is used in many cases. In the power semiconductor device, a transistor such as an IGBT serves as a switch of power and controls an on/off state of the switch, and accordingly a desired amount of power is supplied to a load, to thereby control an operating state of the load. Further, a load and a parasitic inductance component are present even if a transistor switch that controls a large amount of power is turned off (interrupted), and thus the current cannot be interrupted instantaneously. Therefore, a diode is provided in parallel with the transistor to bypass the current during interruption.

That is, the circuitry of FIG. 1A is basic one, and the number of circuits increases depending on use of control, such as a single phase and three phases. FIG. 1B shows an inverter circuit of a three-phase half-bridge that is frequently used. A power semiconductor device has the circuitry surrounded by each dotted line of FIG. 1B in some cases, and accordingly the number of power semiconductor elements such as transistors and diodes that are incorporated into the device varies.

For example, in the combination of IGBTs and flywheel diodes, one element is used in the configuration of a circuit 1 surrounded by a dotted line, two elements are used in a circuit 2 surrounded by a dotted line, and six elements are used in a circuit 3 surrounded by a dotted line. Further, depending on current capacity, power semiconductor elements are arranged in parallel to be incorporated in many cases, which increases the number of elements by multiplication of the number of parallel connections. On the other hand, in a MOSFET, incorporated parasitic diodes are used as flywheel diodes in many cases, and thus the number of elements varies.

In a first preferred embodiment, description will be given based on an example of the circuit 1 of FIG. 1B for the sake of convenience. Needless to say, similar effects are obtained by other number of elements and circuitry, and rather, wiring lines are concentrated as the number of elements increases, which brings about more advantages to miniaturization and weight reduction.

Figure 2:
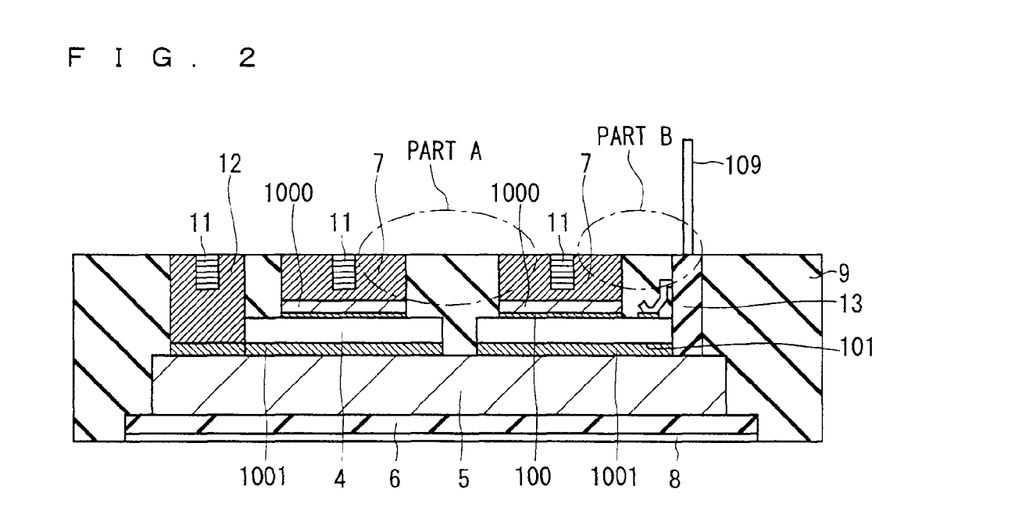
FIGS. 2 to 5 are schematic cross-sectional views of the power semiconductor device according to the first preferred embodiment.

FIG. 2 is a schematic cross-sectional view of a power semiconductor device for describing the first preferred embodiment of the present invention. A lower surface electrode pattern 101 is formed on a lower surface of each of power semiconductor elements 4, and a part of a heat spreader 5 is soldered and fixed as a second metal block to the lower surface electrode pattern 101 through a solder layer 1001. As described above, the power semiconductor elements 4 include an IGBT and an FwDi in combination, and the heat spreader 5 also functions as a conducting path.

Provided below the heat spreader 5 is an insulating layer. The insulating layer is, for example, an insulating sheet 6 obtained by mixing a filler into a resin mainly made of epoxy, which ensures electrical insulation between the heat spreader 5 and the outside of the power semiconductor device. Provided further therebelow is a plate 8.

On the other hand, in the power semiconductor element 4, an upper surface electrode pattern 100 is selectively formed as a first upper surface electrode pattern on an upper surface thereof, and a metal block 7 as a first metal block is soldered through a solder layer 1000 to be fixed. The metal blocks 7 are individually fixed above the IGBT and FwDi, and female screws 11 are formed from the surfaces opposite to the surfaces to which the power semiconductor element 4 is fixed.

Further, a metal block 12 as a third metal block that is connected to another part of the upper surface of the heat spreader 5 through the solder layer 1001 is fixed to the side of one of the power semiconductor elements 4. Similarly to the metal block 7, also in the metal block 12, the female screw 11 is formed from the upper surface and an upper surface thereof is exposed from the mold resin 9. Moreover, an outsert fixing guide 13 is fixed to the other side of the power semiconductor element 4. The outsert fixing guide 13 is formed of a resin, and a signal terminal 109 is connected to an upper surface thereof.

In the power semiconductor device, respective contained members are integrally supported by the mold resin 9 such that the surfaces of the metal blocks 7 and 12 on the side on which the female screw 11 is formed and the surface of the insulating sheet 6 or the plate 8 provided below the insulating sheet 6 are exposed.

On this occasion, the metal block 7 is bonded to the upper surface electrode pattern 100 with the periphery of the power semiconductor element 4 being left, and the female screw 11 is configured so as to be positioned substantially above the power semiconductor element 4. With the use of the female screws 11 arranged in this manner, the power semiconductor element 4 and the outside of the power semiconductor device can be caused to have the shortest distance. Accordingly, it is possible to minimize a wiring resistance and an inductance, which enables loss reduction.

Further, the metal block 7 and the heat spreader 5 having a predetermined thickness are provided so as to vertically sandwich the power semiconductor element 4 therebetween, and thus the power semiconductor element 4 does not warp, which reduces the stress on solder. It is preferable that the thickness of each of the metal blocks 7 be approximately 1 to 5 mm and a difference in thickness between the metal block 7 and the heat spreader 5 be 1 to 2 mm or smaller.

In the first preferred embodiment, independent metal blocks 7 are respectively mounted on two power semiconductor elements 4 of an IGBT and an FwDi, and when a bus bar (not shown) is provided outside the power semiconductor device and the upper surface electrode patterns 100 of the IGBT and the FwDi are electrically connected to each other through the bus bar, wiring is made with a simpler structure compared with the case where wiring is made inside the device. In addition, wiring between the IGBT and the FwDi is not required by incorporating the power semiconductor device into wiring of an apparatus in which the device is contained, which reduces the number of members.

Further, when a large number of ones obtained by soldering the metal block 7 to the upper part of the power semiconductor element 4 through the solder layer 1000 are manufactured and then are soldered to the heat spreader 5 through the solder layer 1001, the power semiconductor elements 4 are easily handled, which is convenient in terms of productivity.

Provided on the same surface as the upper surface electrode pattern 100 of the IGBT is a second upper surface electrode pattern (not shown) selectively formed for driving the IGBT, and the second upper surface electrode pattern is bonded to a metal wire (not shown). An end of this metal wire, which is different from an end connected to the second upper surface electrode pattern, projects toward the outside of the device from the same surface as the surface of the power semiconductor device on which the metal block 7 is exposed, and is connected to a control board (not shown) or the like.

A plurality of second upper surface electrode patterns are formed in one IGBT, and thus a plurality of metal wires are supported by a resin support member (not shown) while being insulated thereby. The resin support member as a support member is positioned and fixed to, for example, the heat spreader 5, and positioning means (not shown) for positioning and fixing are provided to the resin support member and the heat spreader 5. The metal wires can be fixed with excellent positioning accuracy by the positioning means. In this manner, a plurality of second upper surface electrode patterns and a plurality of metal wires are bonded to each other and are integrally held, by the mold resin 9, together with the other member.

Figure 3:
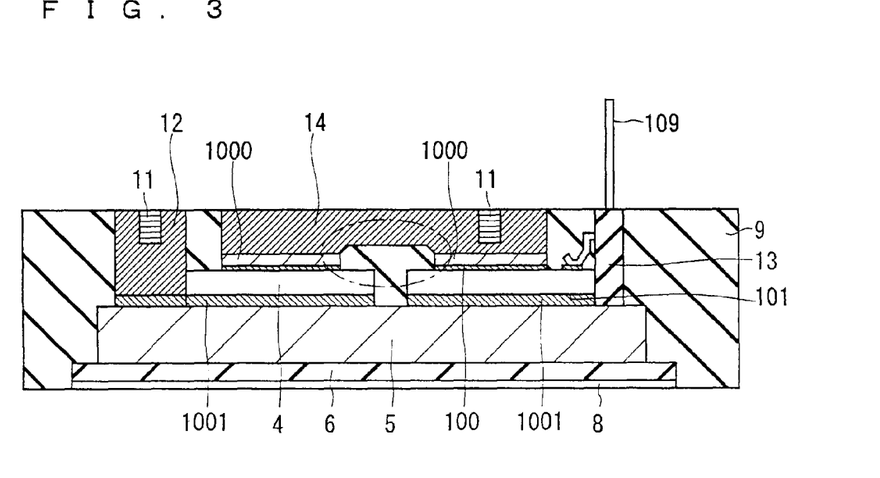

Alternatively, as shown in FIG. 3, there may be used a structure in which wiring is made by bonding the upper surface electrode patterns 100 of the IGBT and the FwDi to the same metal block 14. In this case, connection portions with the wiring lines in an apparatus outside the device are reduced, which improves workability as well as reliability.

Further, the metal block 14, the power semiconductor element 4 and the mold resin 9 housed in the power semiconductor device have linear expansion coefficients that are considerably different from each other, which causes warps. With the structure shown in FIG. 3, the metal block 14 and the heat spreader 5 that have large areas vertically are provided with the power semiconductor element 4 being sandwiched therebetween, and accordingly warps of a package are reduced. A recess is formed in the metal block 14 provided on the upper surface electrode pattern 100 except for a region to be soldered as indicated by a part C in FIG. 3, whereby it is possible to prevent solder wetting from spreading.

Figure 4:
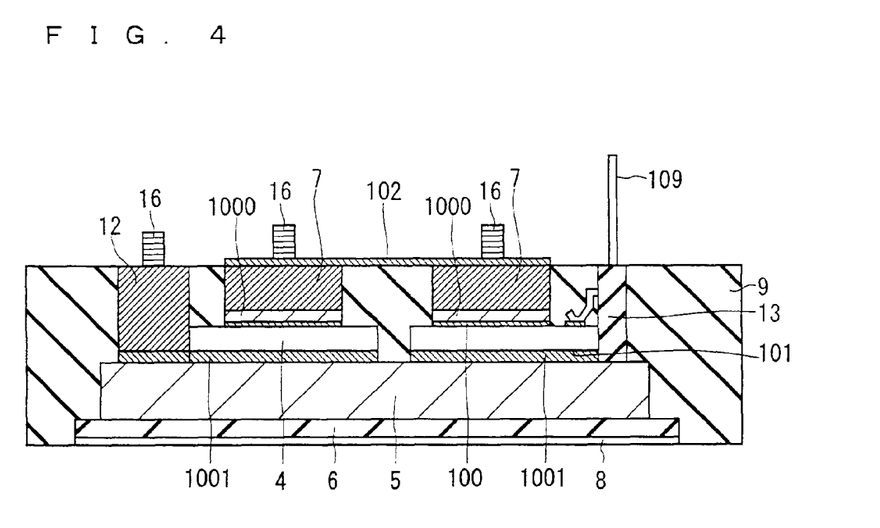

Further, as shown in FIG. 4, the metal block 7 including a male screw 16 may be bonded to the upper surface electrode pattern 100 of the power semiconductor element 4 so as to be positioned on the side opposite to the power semiconductor element 4, and the male screw 16 may be molded by the mold resin 9 so as to project toward the outside of the power semiconductor device. On this occasion, the male screw 16 is formed also on the surface of the metal block 12 on which the mold resin 9 is exposed. In this case, a bus bar (lead piece 102) is provided to the outside of the device and the upper surface electrode patterns 100 of the IGBT and the FwDi are connected as in FIG. 2, which enables optimization because a wiring line may be shared by an apparatus.

Figure 5:
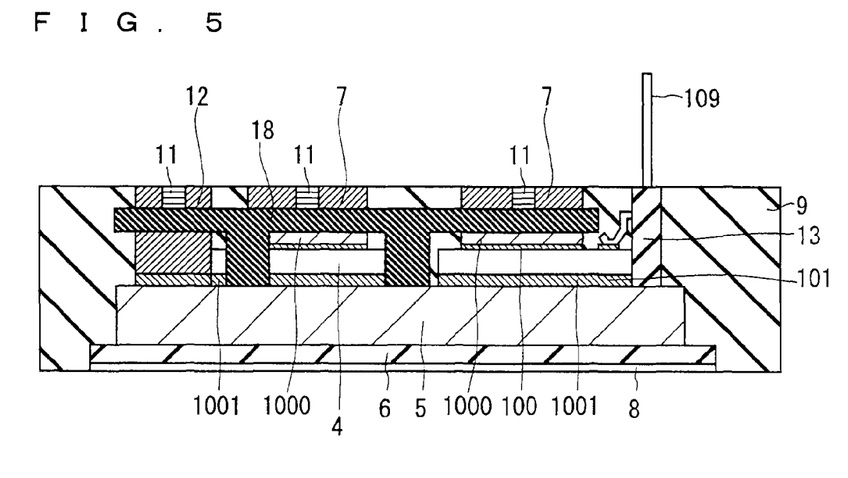

In FIG. 5, connection is made by a metal block fixing guide 18 as an insulating member made of a resin, which is firmly bonded to the metal blocks 7 and 12 soldered to the upper surface electrode patterns 100 of the IGBT and the FwDi and the heat spreader 5. The metal block fixing guide 18 is incorporated so as to be placed on the heat spreader 5. The metal block fixing guide 18, the metal blocks 7 and 12 and the heat spreader 5 may be assembled. Alternatively, the metal blocks 7 and 12 may be subjected to insert molding in advance and be integrated with the metal block fixing guide 18, which may be assembled with the heat spreader 5. Still alternatively, the metal blocks 7 and 12 and the heat spreader 5 may be integrally subjected to insert molding. While FIG. 5 shows the case where the female screws 11 are formed on the upper surfaces of the metal blocks 7 and 12, the male screws 16 may be provided.

In this case, the surface of the metal block fixing guide 18 that is in contact with the heat spreader 5 may be molded such that the exposed surfaces of a plurality of metal blocks 7 and 12 are flush with each other. Accordingly, the exposed surfaces of the metal blocks 7 and 12 are flush with each other when a resin housing is subjected to molding to be manufactured, and can be exposed while being abutting against a mold.

Note that the metal block fixing guide 18 is substantially entirely covered with the mold resin 9 as shown in FIG. 5. As a result, an interface between resins is not present in the outside, which prevents moisture from entering and improves reliability. In particular, high voltage is applied to the metal blocks, and thus the metal block fixing guide 18 is preferably included in the mold resin 9 for securing the insulating reliability of the metal blocks.

Figure 6A:
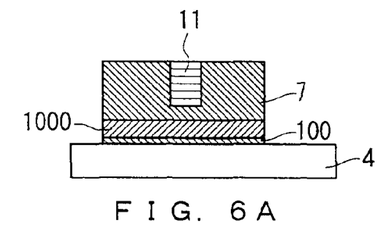
FIGS. 6A and 6B show the configuration of a metal block of the power semiconductor device according to the first preferred embodiment.
Figure 6B:
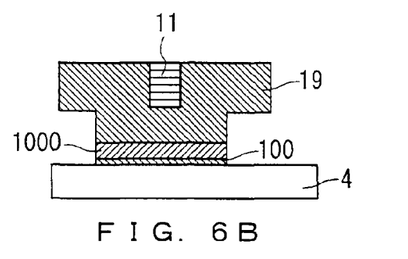

The metal blocks 7 and 12 are simple rectangular parallelepipeds (cross section) in FIG. 4, but may be formed as shown in, for example, FIGS. 6A and 6B. That is, the metal blocks 7 and 12 may be a metal block 19 having a shape obtained by adding a T-shaped step to the structure of FIG. 6A, as shown in FIG. 6B. As a result, a cross-sectional area of a current path (cross-sectional area of the metal block 19 parallel to the upper surface electrode) can be increased while ensuring the creepage distance between the metal block 19 connected to the upper surface electrode pattern 100 and the heat spreader 5 connected to the lower surface electrode pattern 101, which reduces resistance loss. In addition, it is possible to improve the metal-to-metal fastening strength.

It is also possible to improve the fastening strength by providing groove-like or linear projections to the metal block 7 in a direction perpendicular to a rotation direction of fastening, on the outside with respect to the center of the metal block 7. Moreover, it is possible to improve the fastening strength by subjecting the surface of the metal block 7 to surface roughening.

Figure 7A:
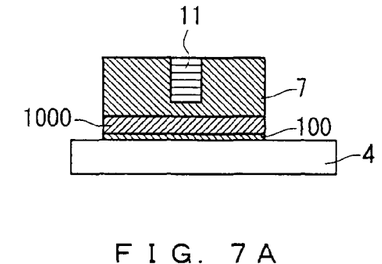
FIGS. 7A and 7B show the configuration of a metal block of the power semiconductor device according to the first preferred embodiment.
Figure 7B:
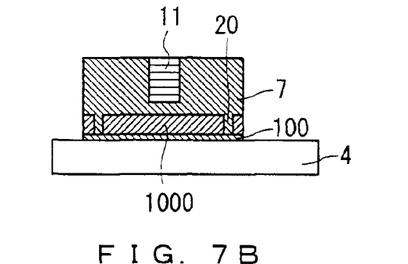

A back surface of the metal block 7 which is also the surface soldered to the upper surface electrode patter 100 may be formed as shown FIGS. 7A and 7B. That is, a projection 20 can be formed in the structure of FIG. 7A as shown in the structure of FIG. 7B. The projection 20 may be formed to form a circle or the projections 20 may be formed at a plurality of spots.

The formation of the projection 20 enables control of the thickness of the solder layer 1000 between the metal block 7 and the upper surface electrode pattern 100, which improves the parallelism of the surface of the metal block 7 on which the female screw 11 is formed. Further, in the first preferred embodiment, while the projection 20 is formed as a structure integrated with the metal block 7, a spacer made of other member may be interposed between the metal block 7 and the upper surface electrode pattern 100. This also holds true for the surface of the heat spreader 5 soldered to the lower surface electrode pattern 101 of the power semiconductor element 4.

If the parallelism of the surface on which the female screw 11 is formed is improved, the adherence to a mold is improved when being molded. Accordingly, it is possible to prevent the mold resin 9 from entering the connecting means such as the female screw 11 in molding, which improves the quality of manufacturing a power semiconductor device.

A-2. Effects

According to the first preferred embodiment of the present invention, the power semiconductor device includes: the power semiconductor element 4; the metal block 7 as a first metal block that is connected to the power semiconductor element 4 through the upper surface electrode pattern 100 as a first upper surface electrode pattern selectively formed on the upper surface of the power semiconductor element 4; and the mold resin 9 filled so as to cover the power semiconductor element 4 and the metal block 7, wherein an upper surface of the metal block 7 is exposed from the surface of the mold resin 9. Accordingly, a wiring line can be drawn from the upper surface of the power semiconductor device, which prevents the device from increasing in size.

Further, the length of the wiring line to the outside of the device can be shortened, and thus an inductance due to the wiring line is reduced and wiring loss can be minimized.

Accordingly, it is possible to provide a power semiconductor device with small heat generation.

Further, the power semiconductor device has the structure in which the inside thereof is entirely filled with the mold resin 9, which improves the rigidity of the power semiconductor device.

Further, the wiring line from the metal block 7 and the wiring line from the metal block 12 can be integrally handled by the same substrate disposed, for example, above the power semiconductor device.

Further, according to the first preferred embodiment of the present invention, the power semiconductor device further includes: the heat spreader 5 as a second metal block, a part of an upper surface thereof being connected to the power semiconductor element 4 through the lower surface electrode pattern 101 formed below the power semiconductor element 4; and the metal block 12 as a third metal block 12 that is connected to another part of the upper surface of the heat spreader 5 and covered with the mold resin 9, wherein the metal block 12 is exposed from the surface of the mold resin 9. Accordingly, heat dissipation of the power semiconductor device is increased, and such a configuration that the power semiconductor element 4 is vertically sandwiched is obtained. This prevents the power semiconductor element 4 from warping and reduces the stress on the solder.

Further, according to the first preferred embodiment of the present invention, the power semiconductor device further includes the metal block fixing guide 18 as an insulating member that integrally connects the metal blocks 7 and 12 as the first and third metal blocks and is disposed so as to be supported by the heat spreader 5 as a second metal block. Accordingly, the exposed surfaces of the metal blocks 7 and 12 can be formed to be flush with each other with respect to the surface of the heat spreader 5, which prevents a resin from flowing into the surfaces of the metal blocks 7 and 12 in molding.

Further, it is possible to make the device film thinner with the effective use of the space on the upper surface of the power semiconductor device.

Further, according to the first preferred embodiment of the present invention, in the power semiconductor device, the metal block 7 as the first metal block and the metal block 12 as the third metal block include the female screws 11 on the upper surfaces thereof. Accordingly, the power semiconductor device and the outside can be connected with the shortest distance, which enables minimization of wiring resistance and inductance.

Further, according to the first preferred embodiment of the present invention, in the power semiconductor device, the metal block 7 as the first metal block and the metal block 12 as the third metal block include the female screws 16 on the upper surfaces thereof. Accordingly, the power semiconductor device and the outside can be connected with the shortest distance, which enables minimization of wiring resistance and inductance.

Further, the thickness for bolt insertion is not required, which enables a reduction in profile of the power semiconductor device.

B. Second Preferred Embodiment

B-1. Configuration

Figure 8A:
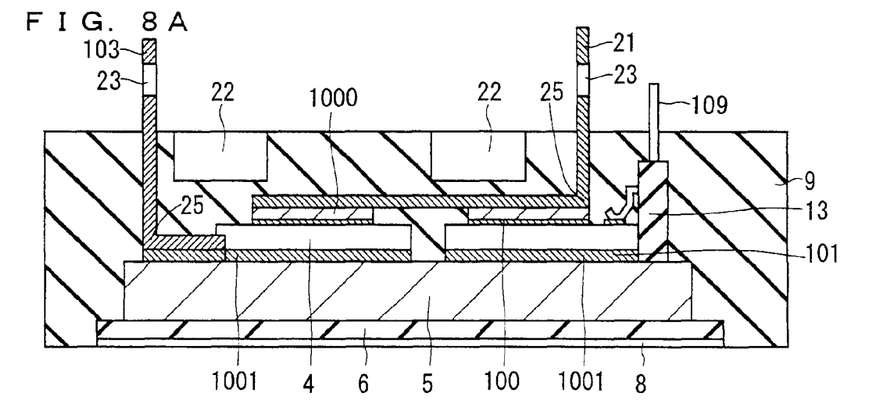
FIGS. 8A, 8B, 8C, 9A, and 9B are schematic cross-sectional views of a power semiconductor device according to a second preferred embodiment.
Figure 8B:
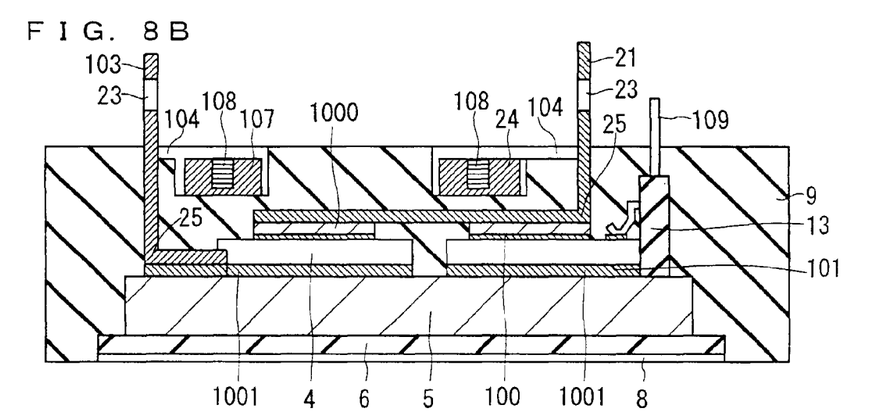
Figure 8C:
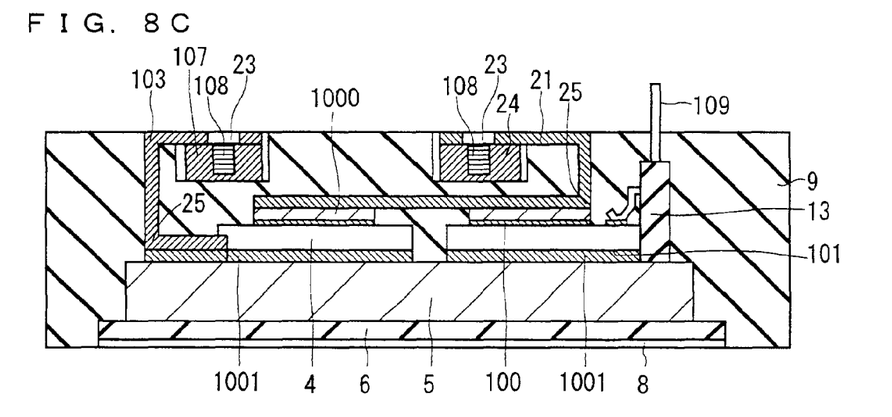

FIGS. 8A, 8B and 8C show a power semiconductor device for describing a second preferred embodiment of the present invention. Soldered to the upper surface electrode patterns 100 of IGBT and FwDi, which are the power semiconductor elements 4, and the heat spreader 5 through the solder layers 1000 and 1001 are one ends of a metal lead 21 as a first metal lead and a metal lead 103 as a second metal lead, respectively, and the other ends thereof project from the upper surface of the power semiconductor device (FIG. 8A). Then, the mold resin 9 is filled so as to cover the power semiconductor elements 4, and the one ends of the metal leads 21 and 103.

Formed on part of the upper surface of the power semiconductor device on the inner side than the protruding portions of the metal leads 21 and 103 in plan view are insertion holes 22 as recesses for inserting, thereinto, a metal block 24 (nut) as a first metal block and a metal block 107 (nut) as a third metal block, and the metal blocks 24 and 107 are inserted into the insertion holes 22 (FIG. 8B).

Note that part of the heat spreader 5 as the second metal block is soldered and fixed to the lower surface electrode pattern 101 of the power semiconductor element 4 through the solder layer 1001, and the metal block 107 is formed above the heat spreader 5 through the metal lead 103.

Formed at the other ends (projecting portions) of the metal leads 21 and 103 are holes 23. The metal leads 21 and 103 are bent in the direction toward the inner side of the power semiconductor device, that is, in the directions toward the metal blocks 24 and 107 so as to be substantially parallel to upper surfaces of resin housings and are formed so as to be in contact with the upper surfaces of the metal blocks 24 and 107 and such that the holes 23 of the metal leads 21 and 103 coincide with females screws 108 of the metal blocks 24 and 107 (FIG. 8C). Note that the metal leads 21 and 103 extend along the sides of the metal blocks 24 and 107 until they reach the upper surfaces of the metal blocks 24 and 107.

In the case of FIG. 1 of the first preferred embodiment, the dimensional accuracy is required to be designed with high accuracy for sealing the connection parts of the metal blocks 7 and 12 in molding, whereas in the second preferred embodiment, the dimension and the mold are not required to be designed with high accuracy because the connection parts are formed after molding as shown in FIGS. 8A, 8B and 8C. Accordingly, the structure in which a wiring line is drawn from above the power semiconductor element 4 to the outside of the device can be manufactured with dramatically improved productivity, which is extremely useful in industrial fields.

The metal blocks 24 and 107 are provided in the inner side than the projecting portions of the metal leads 21 and 103 in plan view on the surface of the power semiconductor device, and thus areas above the IGBT and the FwDi can be used effectively, which makes the device compact. In addition, the upper portion of the power semiconductor device can be formed to be externally wired, which makes the entire device compact. In this case, resin housings are densely filled with a resin so as to support the metal blocks 24 and 107, which makes it possible to secure the rigidity in fastening. Note that the female screws 108 of the metal blocks 24 and 107 are formed to have a depth such that a bolt in fastening can be inserted thereinto.

A bending part 25 in the case of bending the metal lead 21 is bent such that the metal leads 21 and 103 are housed in grooves 104 that are formed on the mold resin 9 side and have a thickness of substantially equal to those of the metal leads 21 and 103. Therefore, after being bent, the metal leads 21 and 103 are positioned by the grooves 104, and accordingly can be prevented from deviating from the metal blocks 24 and 107.

Further, the grooves 104 can be formed so as to be tilt slightly deeply toward the directions of the metal blocks 24 and 107 from the bending parts 25. Accordingly, the metal leads 21 and 103 can be held to be substantially parallel to the upper surface of the power semiconductor device even when springback occurs after being bent.

Figure 9A:
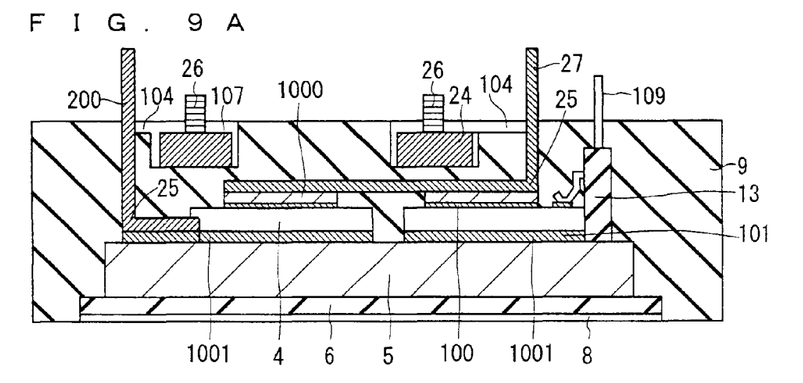
Figure 9B:
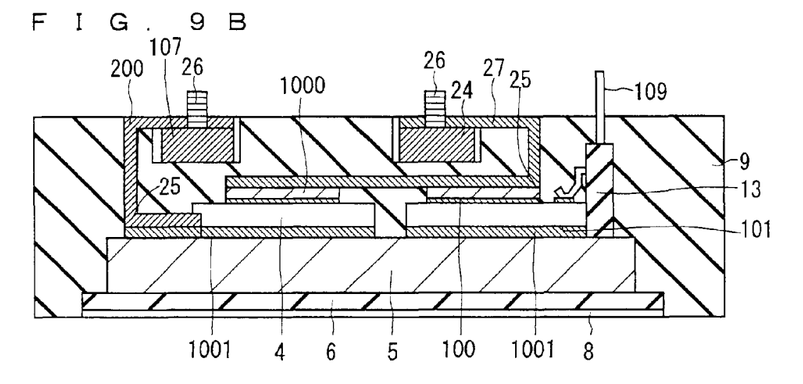
Figure 10:
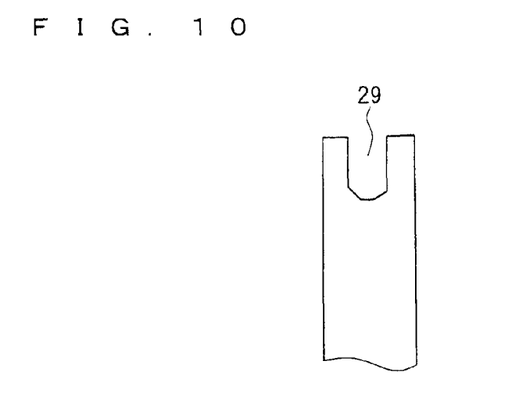
FIG. 10 shows a shape of a metal lead tip of the power semiconductor device according to the second preferred embodiment.

In a power semiconductor device shown in FIGS. 9A and 9B, the metal blocks 24 and 107 and the bolts 26 are inserted into the insertion holes 22 formed on part of the upper surface of the power semiconductor device (FIG. 9A). The projecting portions of the metal leads 27 and 200 are bent toward the bolt 26 side so as to be substantially parallel to the upper surfaces of the resin housings and be in contact with the upper surfaces of the metal blocks 24 and 107 (FIG. 9B). In this case, as shown in FIG. 10, a crab-claw-like opening 29 that forks into two branches like a crab claw is formed at the tips of the projecting portions of the metal leads 27 and 200. The bolts 26 are inserted into the openings 29 when the projecting portions of the metal leads 27 and 200 are bent, and the projecting portions are bent such that the surfaces of the metal leads 27 and 200 are substantially parallel to bearing surfaces of the bolts 26.

The fastening parts are on the bearing surfaces of the bolts 26 in this manner, and thus the depth of the insertion holes 22 for insertion can be reduced, which is effective for slimming down a power semiconductor device.

B-2. Effects

According to the second preferred embodiment of the present invention, the power semiconductor device includes: the power semiconductor element 4; the metal lead 21, 27 as the first metal lead having one end side connected to the power semiconductor element 4 and the other end side being guided above the power semiconductor element 4; the mold resin 9 filled so as to cover the power semiconductor element 4 and the one end side of the first metal lead 21, 27 and having the insertion hole 22 as a recess that is formed above the power semiconductor element 4; and the metal block 24 (nut) as the first metal block that is housed in the insertion hole 22, wherein the other end side of the first metal lead 21, 27 is connected to the upper surface of the metal block 24 by being bent. Accordingly, it is possible to prevent the device from becoming large.

Further, the metal lead 21, 27 and the metal block 24 are connected after being molded, and thus displacement of the metal lead 21, 27 and the metal block 24 can be adjusted, which increases the productivity because the dimension and the mold are not required to be designed with high accuracy.

In a case where the metal lead 21, 27 is connected to the metal block 24 in molding, it is difficult to cause the surface of the metal block 24 and the surface of the mold resin 9 to be flush with each other in terms of accuracy, which leads to a fear that the mold resin 9 might flow into the connection part. In contrast to this, in the present invention, the connection is performed along the upper surface of the resin housing after molding, which may solve the problems such as poor contact and poor assembly due to the inflow of the mold resin 9.

Further, the power semiconductor device has the structure in which the inside thereof is entirely filled with the mold resin 9, which improves the rigidity of the power semiconductor device.

Further, the wiring line from the metal block 24 and the wiring line from the metal block 107 can be handled integrally by the same substrate disposed, for example, above the power semiconductor device.

Further, according to the second preferred embodiment of the present invention, in the power semiconductor device, the metal lead 21, 27 as a first metal lead is formed to extend along the side of the metal block 24 as a first metal block and be bent in a direction toward the metal block 24 on the surface of the mold resin 9. Accordingly, the space above the power semiconductor element 4 can be used effectively, which makes the device compact.

Further, according to the second preferred embodiment of the present invention, the power semiconductor device further includes: the heat spreader 5 as a second metal block that is covered with the mold resin 9, a part of the upper surface thereof being connected to the power semiconductor element 4 through the lower surface electrode pattern 101 formed below the power semiconductor element 4; and the metal block 107 as a third metal block that is formed in the recess provided in the mold resin 9 above the heat spreader 5 and connected to another part of the upper surface of the heat spreader 5 through the metal lead 103, 200 as a second metal lead that has one end side covered with the mold resin 9, wherein an end of the metal lead 103, 200 on the other end side connected to the upper surface of the metal block 107 is exposed from the surface of the mold resin 9. Accordingly, there is obtained a structure in which heat dissipation of the power semiconductor device is increased and the power semiconductor element 4 is sandwiched vertically. Therefore, it is possible to prevent the power semiconductor element 4 from warping and reduce a stress on the solder.

C. Third Preferred Embodiment

C-1. Configuration

Figure 11:
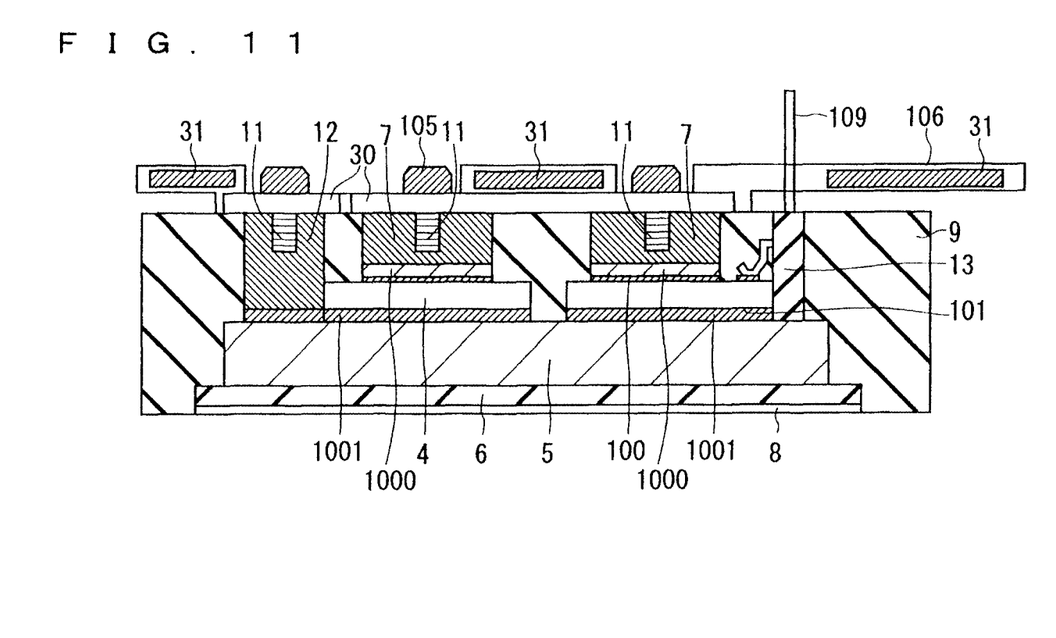
FIG. 11 is a schematic cross-sectional view of a power semiconductor device according to a third preferred embodiment.

FIG. 11 shows the state in which a wiring substrate 106 is mounted above the power semiconductor device of FIG. 2. The wiring substrate 106 is provided with a main wiring line 30 for causing the current to flow from the power semiconductor element 4. The wiring substrate 106 is provided for forming a wiring line of the power semiconductor device and an apparatus, and the wiring line may be formed to be multi-layered. A base material of the wiring substrate 106 can secure insulation between wiring lines by means of, for example, a glass epoxy resin, a PBT resin or a PPS resin. Further, if required, the wiring substrate 106 may include a shield layer 31 as a metal layer for shielding noise from the power semiconductor element 4 so as to be incorporated therein. The shield layer 31 may be formed so as to surround the metal blocks 7 and 12 in plan view. As a result, it is not required to provide a shield plate separately.

The wiring substrate 106 is mounted above the metal blocks 7 and 12 to be connected thereto. The metal blocks 7 and 12 are fastened to the main wiring line 30 of the wiring substrate 106 with bolts or screws 105 to achieve electrical connection. The wiring substrate 106 is provided so as to be in contact with the upper surface of the power semiconductor device, whereby a slim wiring connection structure can be realized.

On the other hand, a metal wire (not shown) connected to the second upper surface electrode pattern through the support member projects from the power semiconductor device on the same surface as the exposed surfaces of the metal blocks 7 and 12, but may be connected to a control substrate forming a control circuit (not shown) above the wiring substrate 106. Alternatively, the wiring substrate 106 may be provided with a wiring line that forms a part or all of the control circuit. As a result, a wired portion of the control circuit can be optimized. Further, a gate resistance wiring line or the like, which is desired to be provided to a position as close to the power semiconductor element 4 as possible, may be provided to the wiring substrate 106.

While FIG. 11 shows the structure of the first preferred embodiment in which the metal blocks 7 and 12 are used, the wiring substrate 106 may also be provided to the structure in which the metal blocks 24 and 107 (nut), metal leads 21 and 103, 27 and 200 as described in the second preferred embodiment are used, and similar effects are achieved also in that case.

C-2. Effects

According to the third preferred embodiment of the present invention, the power semiconductor device further includes the wiring substrate 106 disposed on the mold resin 9 above the metal block 7, 24 as a first metal block and the metal block 12, 107 as a third metal block and connected to the metal block 7, 24, and the metal block 12, 107 as a third metal block. Accordingly, it is possible to achieve a slim wiring connection structure.

Further, according to the third preferred embodiment of the present invention, in the power semiconductor device, the wiring substrate 106 includes the shield layer 31 as a metal layer so as to surround the metal block 7, 24 as the first metal block and the metal block 12, 107 as the third metal block in plan view, and accordingly the power semiconductor element 4 can be protected from noise. In addition, it is not required to provide a shield plate separately.

Further, according to the third preferred embodiment of the present invention, the power semiconductor device further includes: the second upper surface electrode pattern formed on the upper surface of the power semiconductor element 4; and the metal wire connected to the second upper surface electrode pattern by being supported by a support member, wherein: the support member is fixed to the heat spreader 5 as the second metal block; and the wiring substrate 106 is connected to the metal wire. Accordingly, the device can be prevented from increasing in size.

D. Fourth Preferred Embodiment

D-1. Configuration

Figure 12A:
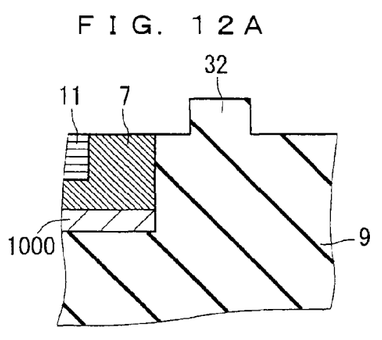
FIGS. 12A, 12B, 13A and 13B show a projection or a groove of a power semiconductor device according to a fourth preferred embodiment.
Figure 12B:
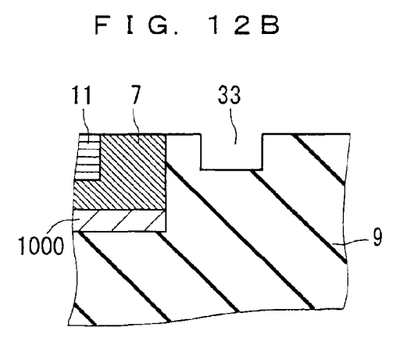

FIGS. 12A and 12B show an enlarged part A of the power semiconductor device described with reference to FIG. 2. On the surface of the mold resin 9, a projection 32 (FIG. 12A) or a groove 33 (FIG. 12B) is formed around the upper surface of the metal block 7. The projection 32 or the groove 33 is formed so as to surround the metal block 7.

The metal block 7 having the same potential as that of the upper surface electrode pattern 100 of the power semiconductor element 4 is applied with a high voltage when the power semiconductor device or an apparatus operates. Therefore, the distance for keeping insulation is required between a peripheral member or a wiring member having a different potential and the metal block 7, and thus the device needs to be increased in size by an amount for securing the distance. In contrast to this, the required creepage distance can be achieved by forming the projection 32 or the groove 33 between the metal block 7 and the other wiring member or the ground, and accordingly the device is not required to be increased in size.

Figure 13A:
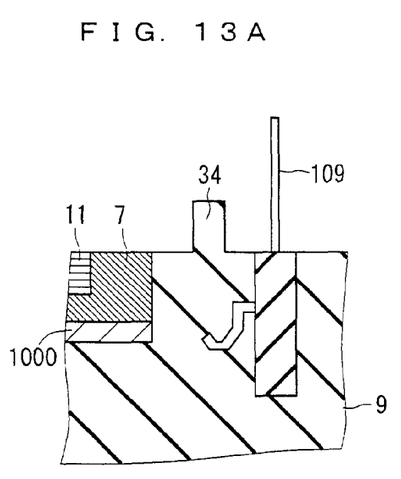
Figure 13B:
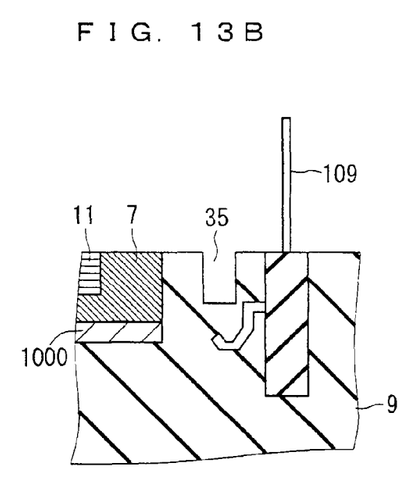

FIGS. 13A and 13B show an enlarged part B of the power semiconductor device of FIG. 2, in which a projection 34 or a groove 35 is formed between the metal block 7 and a signal terminal 109 connected to an end of the outsert fixing guide 13.

The signal terminal 109 includes a gate electrode for driving a gate and sensing terminals of detecting current and temperature, but those have extremely smaller voltages compared with the upper surface electrode pattern 100 or the lower surface electrode pattern 101 of the power semiconductor element. On the other hand, the voltage of the upper surface electrode pattern 100 or the lower surface electrode pattern 101 of the power semiconductor element 4 is high, and thus it is possible to prevent the power semiconductor device from increasing in size and secure an insulation distance by forming the projection 34 or the groove 35 therebetween.

The present invention is capable of, particularly in a power semiconductor device that is desired to be made compact and have light weight, for example, in a power semiconductor device mounted on a vehicle, limiting the size of the power semiconductor device approximately to a projection area of a mold resin, which is considerably useful.

Note that in any preferred embodiments, it is possible to realize a power semiconductor device that is more compact and has higher output by using a power semiconductor element including silicon carbide in at least a part thereof. While this results in the combination of an FwDi and a MOSFET, only the FwDi may include silicon carbide or the FwDi and MOSFET both may include only silicon carbide.

D-2. Effects

According to the fourth preferred embodiment of the present invention, the power semiconductor device further includes, on the surface of the mold resin 9, the projection 32, 34 or the groove 33, 35 formed around the upper surface of the metal block 7 as the first metal block. Accordingly, it is possible to secure a required creepage distance for keeping insulation of the metal block 7 and a peripheral member, which prevents the device from increasing in size.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
    a power semiconductor element;
    a first metal block connected to said power semiconductor element through a first upper surface electrode pattern selectively formed on an upper surface of said power semiconductor element;
    a mold resin filled so as to cover said power semiconductor element and said first metal block,
    wherein an upper surface of said first metal block is exposed from a surface of said mold resin;
    a second metal block, a part of an upper surface thereof being connected to said power semi conductor element through a lower surface electrode pattern formed below said power semi conductor element; and
    a third metal block connected to another part of said upper surface of said second metal block and covered with said mold resin,
    wherein said third metal block is exposed.

2. The power semiconductor device according to claim 1, further comprising an insulating member integrally connecting said first and third metal blocks and disposed so as to be supported by said second metal block.

3. The power semiconductor device according to claim 1, further comprising:
    a second upper surface electrode pattern selectively formed on the upper surface of said power semiconductor element; and
    a metal wire supported by a support member and connected to said second upper surface electrode pattern,
    wherein said support member is fixed to said second metal block.

4. A power semiconductor device, comprising:
    a power semiconductor element;
    a first metal lead having one end side connected to said power semiconductor element and an other end side opposite the one end side guided above said power semiconductor element;
    a mold resin filled so as to cover said power semiconductor element and said one end side of said first metal lead and having a recess formed above said power semiconductor element; and a first metal block housed in said recess and having a lower surface facing said power semiconductor element and an upper surface opposite the lower surface, wherein said other end side of said first metal lead is physically connected to the upper surface of said first metal block by being bent.

5. The power semiconductor device according to claim 4, wherein said first metal lead is formed to extend along a side of said first metal block and be bent in a direction toward said first metal block on a surface of said mold resin.

6. The power semiconductor device according to claim 4, further comprising:

a second metal block covered with said mold resin, a part of an upper surface thereof being connected to said power semiconductor element through a lower surface electrode pattern formed below said power semiconductor element; and a third metal block formed in a recess provided in said mold resin above said second metal block and connected to another part of said upper surface of said second metal block through a second metal lead having one end side covered with said mold resin, wherein an end of said second metal lead on the other end side connected to an upper surface of said third metal block is exposed from the surface of said mold resin.

7. The power semiconductor device according to claim 1, wherein said first and third metal blocks include female screws on upper surfaces thereof.

8. The power semiconductor device according to claim 6, wherein said first and third metal blocks include female screws on upper surfaces thereof.

9. The power semiconductor device according to claim 1, wherein said first and third metal blocks include male screws on upper surfaces there of.

10. The power semiconductor device according to claim 6, wherein said first and third metal blocks include male screws on upper surfaces thereof.

11. The power semiconductor device according to claim 1, further comprising a wiring substrate disposed on said mold resin above said first and third metal blocks and connected to said first and third metal blocks.

12. The power semiconductor device according to claim 6, further comprising a wiring substrate disposed on said mold resin above said first and third metal blocks and connected to said first and third metal blocks.

13. The power semiconductor device according to claim 11, wherein said wiring substrate includes a metal layer so as to surround said first and third metal blocks in plan view.

14. The power semiconductor device according to claim 12, wherein said wiring substrate includes a metal layer so as to surround said first and third metal blocks in plan view.

15. The power semiconductor device according to claim 11, further comprising:

a second upper surface electrode pattern formed on the upper surface of said power semiconductor element; and a metal wire connected to said second upper surface electrode pattern by being supported by a support member, wherein:

said support member is fixed to said second metal block; and said wiring substrate is connected to said metal wire.

16. The power semiconductor device according to claim 12, further comprising:

a second upper surface electrode pattern formed on the upper surface of said power semiconductor element; and a metal wire connected to said second upper surface electrode pattern by being supported by a support member, wherein:

said support member is fixed to said second metal block; and said wiring substrate is connected to said metal wire.

17. The power semiconductor device according to claim 1, further comprising, on the surface of said mold resin, a projection or a groove formed around the upper surface of said first metal block.

18. The power semiconductor device according to claim 4, further comprising, on the surface of said mold resin, a projection or a groove formed around the upper surface of said first metal block.

19. The power semiconductor device according to claim 1, wherein at least a part of said power semiconductor element includes silicon carbide.

20. The power semiconductor device according to claim 4, wherein at least a part of said power semiconductor element includes silicon carbide.

* * * * *